United States Patent [19]
Matsuwaka

[11] Patent Number: 6,065,489
[45] Date of Patent: May 23, 2000

[54] OZONE FLOW RATE CONTROL DEVICE

[75] Inventor: Atsuji Matsuwaka, Tokyo, Japan

[73] Assignee: NEC Corporation, Tokyo, Japan

[21] Appl. No.: 09/090,920

[22] Filed: Jun. 5, 1998

[30] Foreign Application Priority Data

Jun. 5, 1997 [JP] Japan .................................. 9-148107

[51] Int. Cl.$^7$ .................................................. F16K 49/00
[52] U.S. Cl. ........................................ 137/341; 137/487.5
[58] Field of Search .................................. 137/487.5, 341

[56] References Cited

PUBLICATIONS

"Excalibur Gas Processing System Operation and Maintenance" prepared by the Technical Documentation Department of FSI International, Jan. 1989, pp. x, 1–3 to 1–5, and 3–9.

*Primary Examiner*—Gerald A. Michalsky
*Attorney, Agent, or Firm*—Sughrue, Mion, Zinn, Macpeak & Seas, PLLC

[57] ABSTRACT

An ozone flow rate control device for controlling a flow rate of ozone gas supply, according to the present invention, comprises an inlet pipe to which the ozone gas is supplied, a bypass pipe and a sensor pipe branched from the inlet pipe, a control signal generator circuit for measuring a variation of temperature of the sensor pipe and generating a control signal corresponding to a flow rate of the ozone gas, an outlet pipe connected to the bypass pipe and the sensor pipe, a valve provided in the outlet pipe and having an opening controlled correspondingly to the control signal and heating means for heating the ozone gas supplied to the sensor pipe to a predetermined temperature.

17 Claims, 7 Drawing Sheets

OZONE FLOW RATE CONTROL DEVICE

BACKGROUND OF THE INVENTION

1. Field of the Invention

The present invention relates to an ozone flow rate control device and, particularly, to an ozone flow rate control device for controlling flow rate of ozone gas containing nitrogen gas.

2. Description of the Related Art

Figure 1:
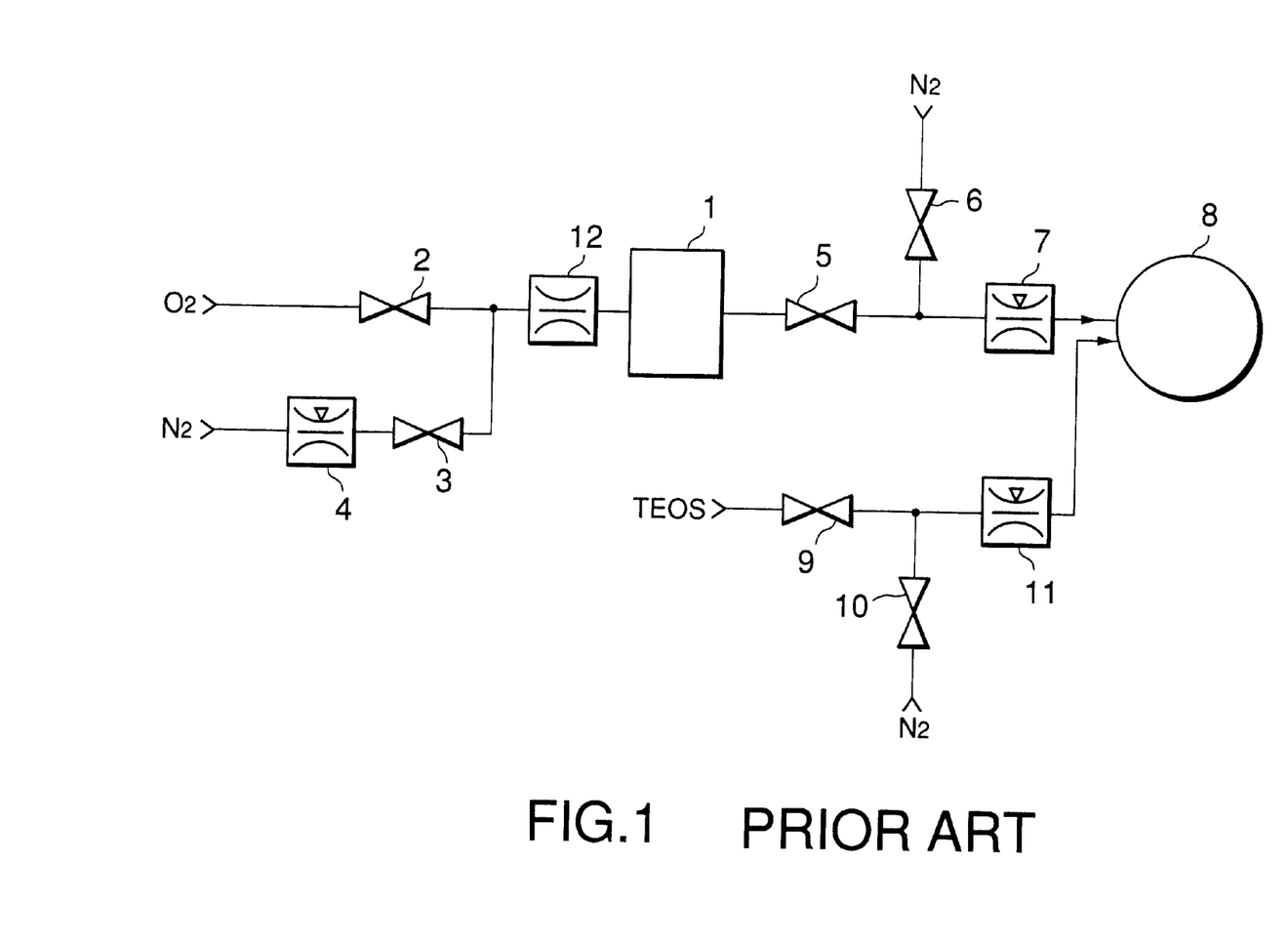
FIG. 1 is a block diagram of a CVD device using a conventional ozone flow rate control device.

The so-called atmospheric pressure CVD is one of methods for forming a thin film on a semiconductor wafer of a semiconductor device. For example, in the atmospheric pressure CVD, a thin film is formed by introducing ozone gas ($O_3$) and a gas such as TEOS ($Si(OC_2H_5)_4$) into a reaction chamber and depositing a reaction product of ozone gas and TEOS on a wafer. In order to obtain such thin film containing a required constituents, it is necessary to maintain a gas flow rate to be introduced into the reaction chamber at a predetermined value by a flow rate control device provided in a gas supply system of the atmospheric pressure CVD device. FIG. 1 is a block diagram showing an example of the gas supply system of the conventional atmospheric pressure CVD. The conventional technology will be described with reference to FIG. 1. In FIG. 1, air valves 2 and 3 for supplying oxygen gas ($O_2$) and nitrogen gas ($N_2$) to an ozone generator 1 are provided, respectively, and a mixture of oxygen gas and nitrogen gas is supplied to a mass flow meter (MFM) 12 for monitoring gas flow rate. In the nitrogen gas line, a mass flow controller (MFC) 4 for controlling nitrogen gas flow rate is connected to an input side of the air valve 3. An air valve 5 is connected to an output side of the ozone generator 1 and a mass flow controller 7 is connected to an input side of an ozone generator 7, for flowing ozone gas to an atmospheric pressure chemical vapor deposition (CVD) chamber 8. An air valve 6 which is alternately on-off controlled with respect to the air valve 5 is connected between the air valve 5 and the mass flow controller 7, for flowing nitrogen gas to the atmospheric pressure CVD chamber 8.

On the other hand, the TEOS gas supply system includes an air valve 9 and a mass flow controller 11 connected to the atmospheric pressure CVD chamber 8. An air valve 10 which is alternately on-off controlled with respect to the air valve 9 is connected between the air valve 9 and the mass flow controller 11 for supplying nitrogen gas to the atmospheric pressure CVD chamber 8.

The reason for the addition of nitrogen gas to oxygen gas in generating ozone will be described. It is possible to generate ozone from only oxygen gas. In such case, however, there is a reduction of ozone concentration with time and it is impossible to maintain ozone concentration high enough. On the other hand, it has been known that it is possible to make concentration of ozone gas higher than that generated from only oxygen gas without reduction of ozone concentration with time, by generating ozone gas by adding 1 to 10 volume % of nitrogen gas, helium gas, argon gas or carbon dioxide gas to oxygen gas. Generally, the gas to be added is nitrogen gas in view of the easiness to supply of nitrogen gas as a line gas of factories, low cost and possibility of maintaining high ozone concentration compared with other additive gases. Particularly, in growing a $SiO_2$ film by using TEOS and ozone gas, ozone concentration must be maintained at about 140 g/Nm$^3$. Therefore, the use of nitrogen gas as the additive gas is advantageous.

Now, an operation of the gas supply system of the atmospheric pressure CVD device will be described. Usually, in forming the thin film, incomplete reaction products are prevented from being formed when gas is introduced to the atmospheric pressure CVD chamber by supplying ozone gas to the atmospheric pressure CVD chamber and, after a constant time lapse while continuing the ozone gas supply, introducing TEOS gas to the chamber. First, nitrogen gas is introduced into the atmospheric pressure CVD chamber 8 under flow rate control of the mass flow controllers 7 and 11 by closing the air valves 2, 3, 5 and 9 with the ozone generator 1 being in an inoperable state and opening the air valves 6 and 10. When the thin film is formed, the air valve 6 is closed and the air valves 2, 3 and 5 are opened to supply, together with oxygen gas, nitrogen gas to the ozone generator 1 at a flow rate determined by the mass flow controller 4 to, for example, 1 volume % of the flow rate of oxygen gas which is determined by the mass flow controllers 7 and 4. In this state, the ozone generator 1 is activated, so that the oxygen gas is converted into ozone having a predetermined concentration and introduced into the atmospheric pressure CVD chamber 8. In this case, it can be judged whether or not the mass flow controller 7 is normally performing the flow rate control, by displaying and comparing the flow rates of the mass flow meter 12 and the mass flow controller 7. The air valves 10 and 9 are closed and opened, respectively, after a constant time lapse from the supply of ozone to the atmospheric pressure CVD chamber 8 to introduce TEOS gas into the atmospheric pressure CVD chamber 8 at a flow rate controlled by the mass flow controller 11, resulting in a thin $SiO_2$ formed on a surface of the semiconductor wafer. After the completion of the formation of thin film, the states of the gas lines are returned to those prior to the film formation.

Figure 2:
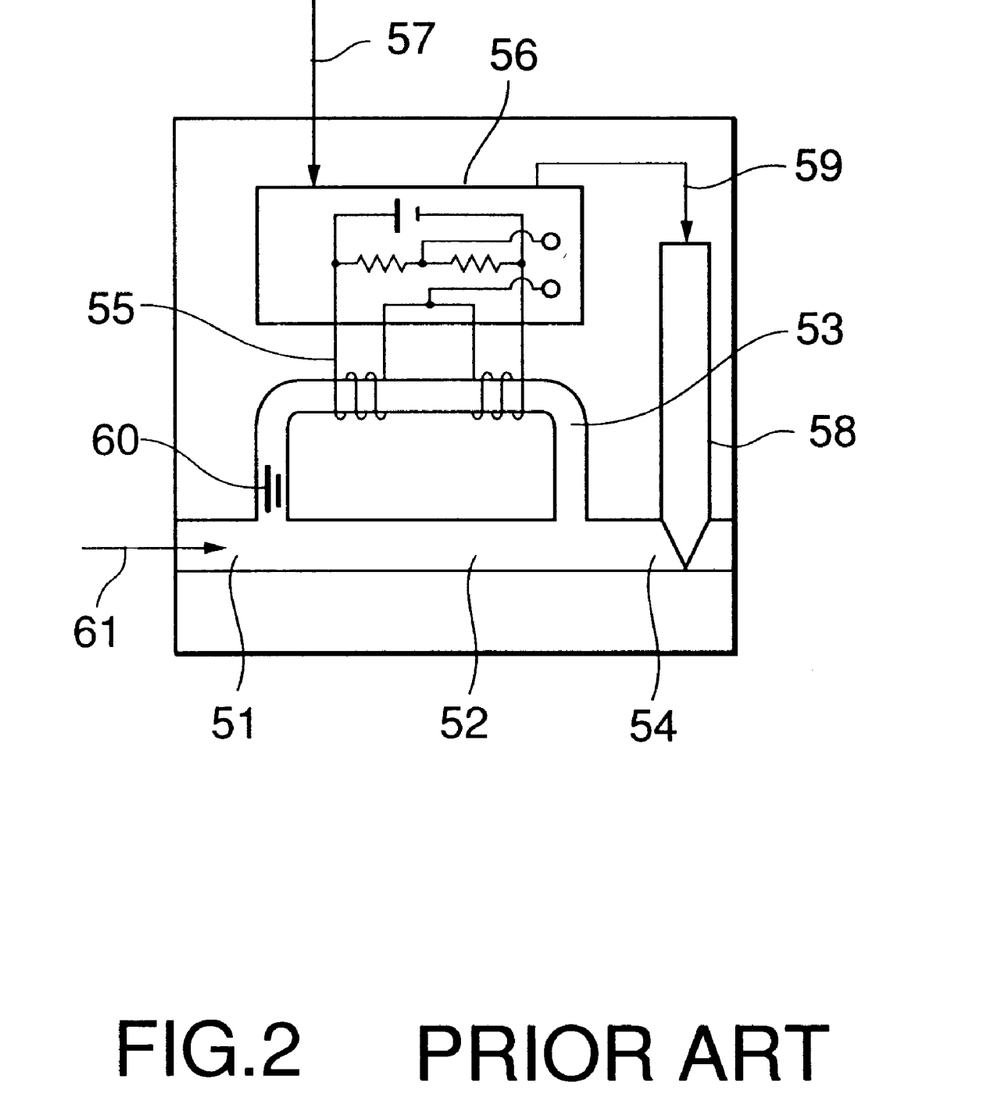
FIG. 2 is a schematic cross section of the ozone flow rate control device shown in FIG. 1.

The mass flow controller and the mass flow meter will be described. FIG. 2 is a cross section of one (7) of the mass flow controllers 4, 7 and 11 which has the same construction. In FIG. 2, a gas flow passage includes an inlet pipe 51 which is branched to a bypass pipe 52 and a sensor pipe 53 which are joined to form an outlet pipe 54, a pair of heater coils 55 provided on an upstream portion and a downstream portion of the sensor pipe 53 having an inner diameter of about 0.3 mm, respectively, for heating the sensor pipe 53, a control portion 56 including a circuit which constitutes a bridge circuit together with the heater coils 55 and a valve 58. When gas flows through the sensor pipe 53, the equilibrium of the bridge circuit is broken by an amount of heat in the sensor pipe 53 and an output signal corresponding to the flow rate of the gas is output from the bridge circuit. The output signal is compared by the control portion 56 with an external flow rate setting signal 57 and a difference therebetween is output as a valve control signal 59 to the valve 58 to control an opening thereof to thereby control the flow rate of the gas.

The mass flow meter has the same construction as that of the mass flow controller except that the mass flow meter has no flow rate control valve such as the valve 58 and operates to merely display the flow rate.

In the prior art mass flow controller having the above mentioned structure, the temperature of a portion of the piping on the upstream side of the sensor pipe 53 on which the heater coils 55 are arranged is always at substantially room temperature during the gas flows through the mass flow controller.

In performing the atmospheric pressure CVD by generating ozone using oxygen gas added with a small amount of nitrogen gas, there is a problem that the conventional mass flow controller having the above mentioned construction and using an ozone gas line containing nitrogen gas can not exactly control the gas flow rate when an accumulated amount of flow rate of ozone gas is increased.

The present inventors had studied this problem and have found that a small amount of nitrogen pentoxide ($N_2O_5$) which is one of nitrogen oxides is produced together with ozone generated in the ozone generator due to nitrogen gas added to oxygen gas for the purpose of restriction of the reduction of concentration of ozone with time and the problem is caused by deposition and accumulation of nitrogen pentoxide in the vicinity of the inlet portion of the sensor pipe of the mass flow controller, whose inner diameter is small and temperature is substantially room temperature.

BRIEF DESCRIPTION OF THE INVENTION

Objects of the Invention

Therefore, an object of the present invention is to provide an ozone flow rate control device having a sensor pipe in which nitrogen oxide is not accumulated.

SUMMARY OF THE INVENTION

An ozone flow rate control device for controlling an amount of supply of ozone gas, according to the present invention, comprises an inlet pipe to which ozone gas is supplied, a bypass pipe and a sensor pipe branched from the inlet pipe, a control signal generator circuit for measuring a variation of temperature of the sensor pipe and generating a control signal corresponding to a flow rate of ozone, an outlet pipe connected to the bypass pipe and the sensor pipe, a valve provided in the outlet pipe and a degree of opening thereof controlled correspondingly to the control signal and heater means for heating ozone gas supplied to the sensor pipe to a predetermined temperature.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 3:
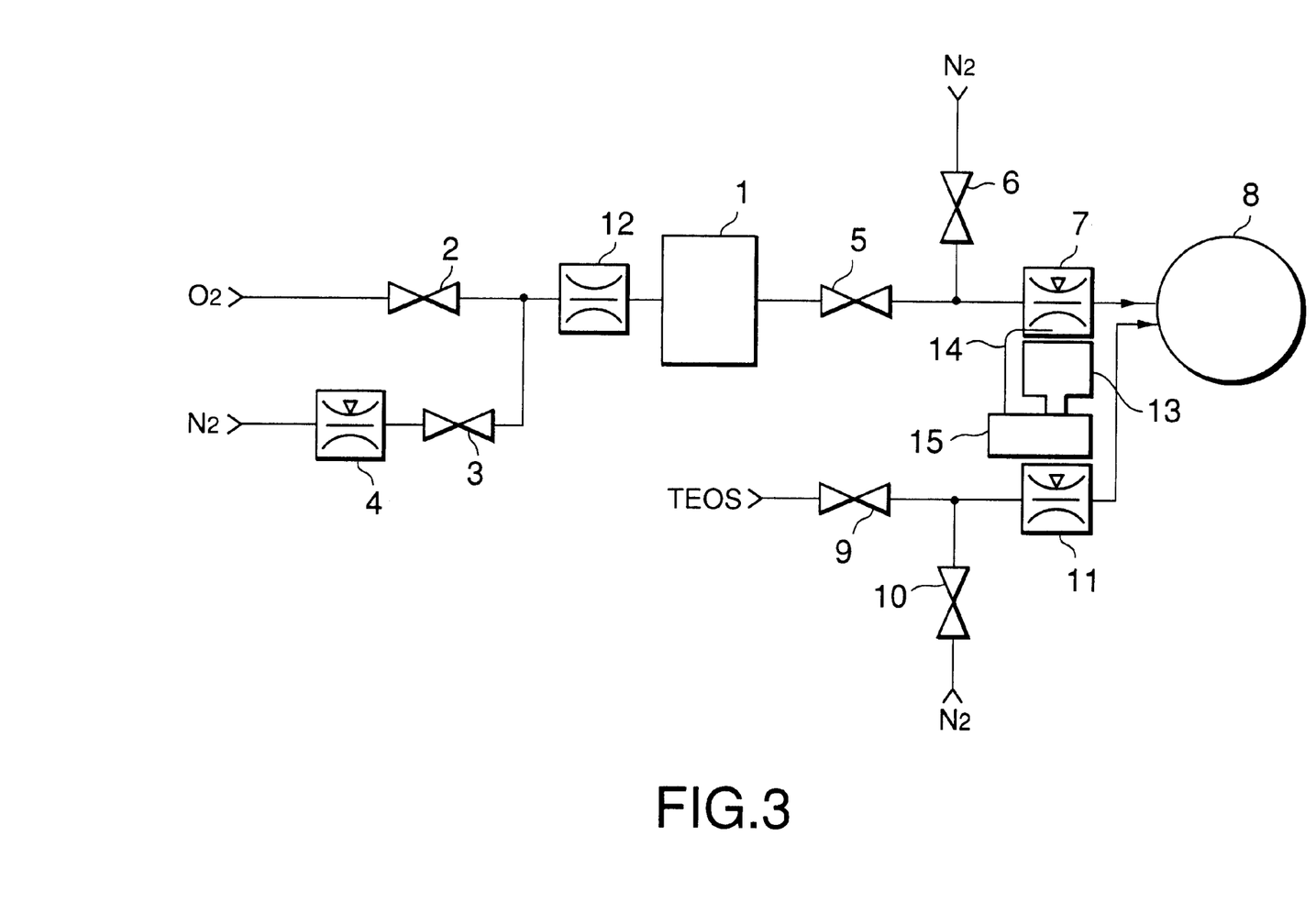
FIG. 3 is a block diagram of a CVD device using an ozone flow rate control device according to a first embodiment of the present invention.
Figure 4:
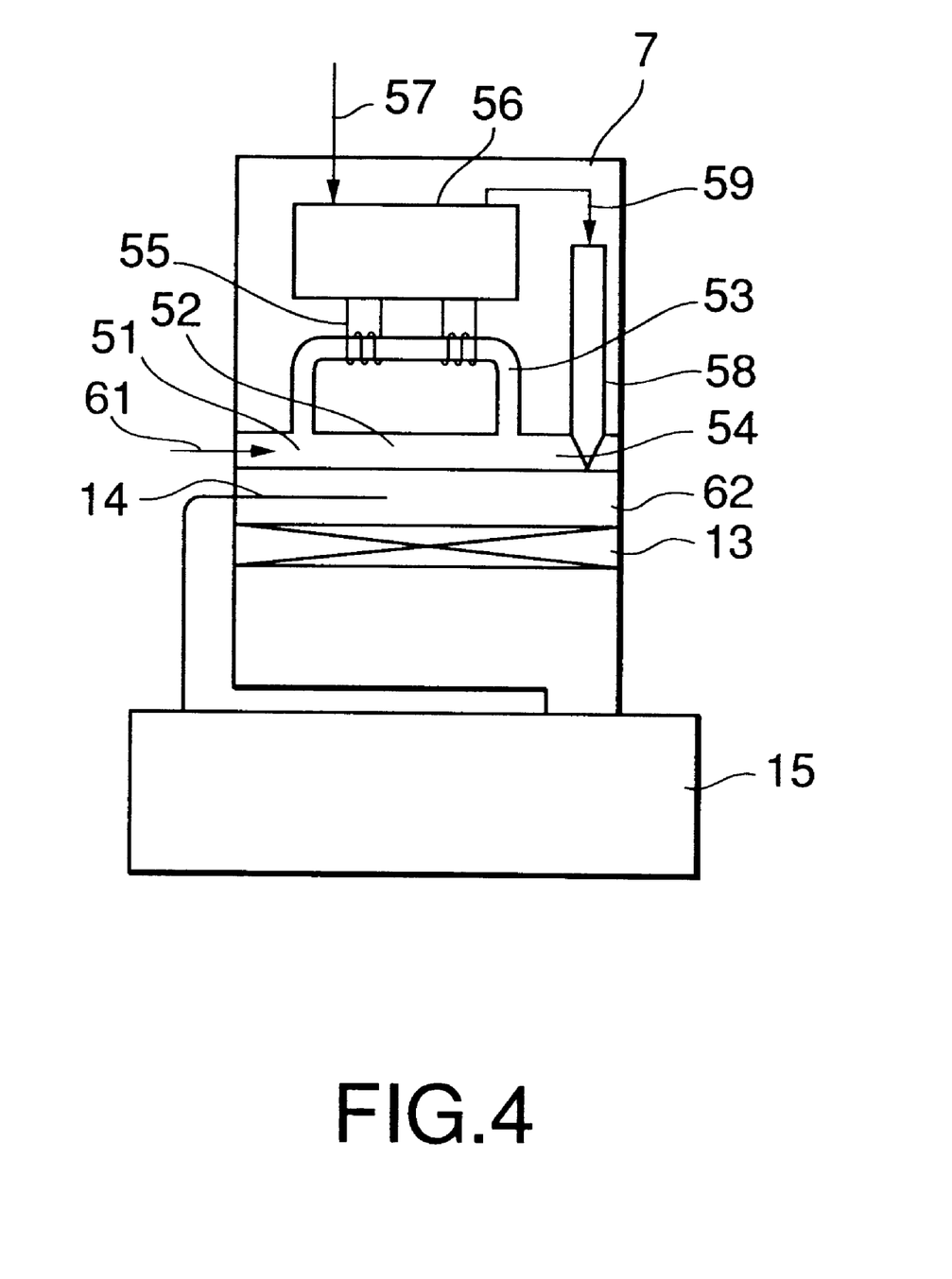
FIG. 4 is a schematic cross section of the ozone flow rate control device shown in FIG. 3.

First, a first embodiment of the present invention will be described with reference to FIGS. 3 and 4, in which FIG. 3 is a block diagram of a gas supply system of an atmospheric pressure CVD device using an ozone flow rate control device according to the first embodiment of the present invention and FIG. 4 is a schematic cross section of a heating portion of the ozone flow rate control device, which is used as a mass flow controller 7 in the gas supply system shown in FIG. 3. Referring to FIG. 4, in the first embodiment of the present invention, a temperature control portion 15 includes a heater 13 mounted on a body portion 62 of the mass flow controller 7 of an ozone line and a temperature sensor 14 embedded in the body portion 62. The temperature control portion 15 compares a temperature detected by the temperature sensor 14 with a predetermined temperature and controls an electric power supplied to the heater 13 such that the temperature detected by the temperature sensor 14 becomes the predetermined temperature.

An operation will be described with reference to FIG. 3. The ozone flow rate control device shown in FIG. 4 is used as the mass flow controller 7 and a temperature of the mass flow controller 7 is set to a predetermined value in a range from 47° C. to 60° C., for example, 50° C. That is, the temperature of the mass flow controller 7 is controlled in the range from 47° C. to 60° C. when ozone gas flows through the mass flow controller 7 with air valves 2, 3 and 5 being open and an ozone generator 1 being in an operable state as well as when ozone gas flows through the mass flow controller with the air valves 2, 3 and 5 being closed, the ozone generator 1 being in an inoperable state and an air valve 6 being open. In other words, the temperature control is performed such that the temperature of the mass flow controller 7 is always in the range from 47° C. to 60° C. Alternatively, it is possible to control the temperature of the mass flow controller 7 in the range from 47° C. to 60° C. only when ozone gas flows through the mass flow controller 7, that is, only when the air valves 2, 3 and 5 are open and the ozone generator 1 is in the operable state. The reason for controlling the temperature of the mass flow controller 7 is based on the fact that there is solid substance in the vicinity of the inlet portion of the sensor pipe 53 of the conventional mass flow controller 7 which is maintained at room temperature and indicates abnormal flow rate and the solid substance includes nitrogen pentoxide which is nitrogen oxide capable of being solidified. Incidentally, nitrogen pentoxide is deliquescent, achromatic solid substance which sublimates at 47° C. and strongly reacts with water to form nitric acid.

Figure 7:
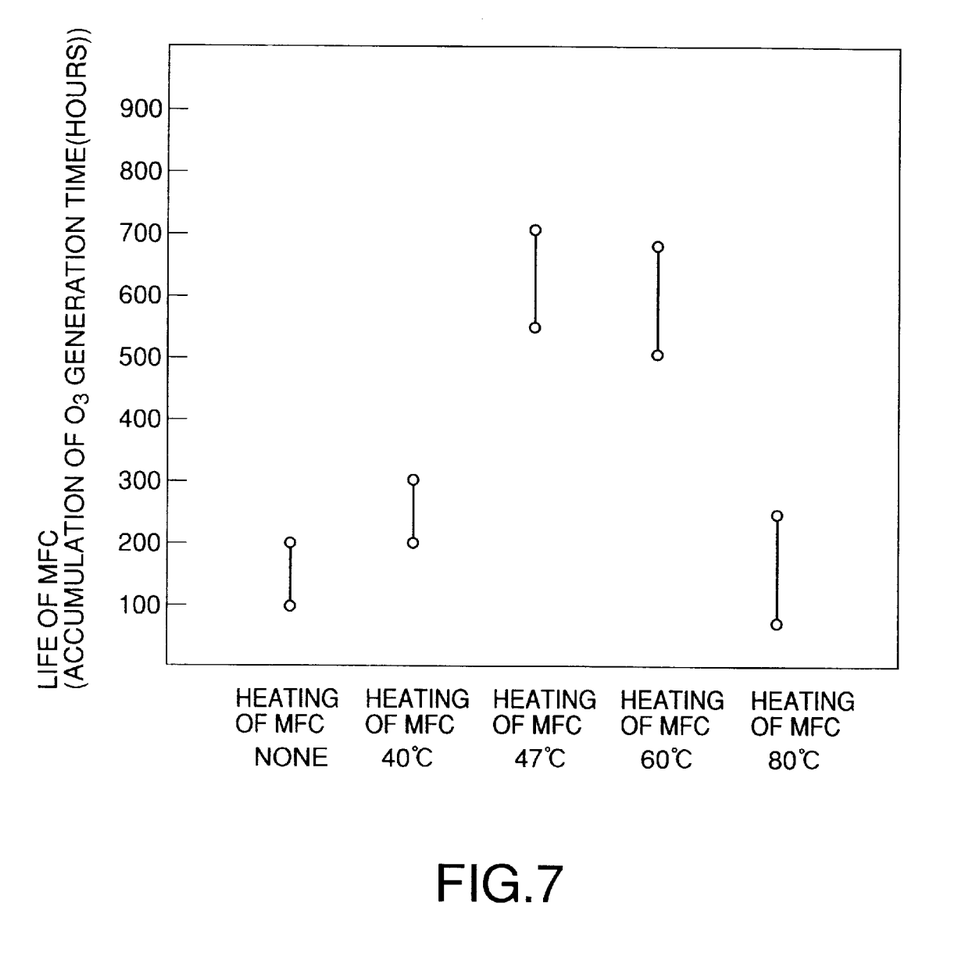
FIG. 7 is a graph showing a relation between heating temperature and life of the ozone flow rate control device of the present invention.

FIG. 7 shows a result of experiments conducted by the inventors to find the optimal temperature of the mass flow controller of the ozone line. In FIG. 7, the flow rate indication of the mass flow controller 7 is compared with the flow rate indication of the mass flow meter 12 and the life of the mass flow controller is determined when the accumulated flow rate of the generated ozone gas is increased and the gas flow rate control by the flow rate controller 7 becomes inaccurate. The value indicated on the ordinate, that is, the life time in hours, is indicated by the accumulated time of ozone generation. In these experiments, the life of the mass flow controller when heated to 47° C. and to 60° C. are as long as 600 to 700 hours and the life when heated to 80° C. is as low as that without heating. The indication of abnormal flow rate by the mass flow controller when the controller is not heated and is heated to 40° C. were caused by accumulated deposition of substance in the vicinity of the inlet portion of the sensor pipe 53 of the mass flow controller 7 and those when heated to 47° C., 60° and 80° C. are caused by corrosion of an inner surface of the piping of the mass flow controller 7. The reason for the short life of the mass flow controller 7 when heated to 80° C. compared with the cases of heating to 47° C. and to 60° C. is considered as higher corrosion speed of the piping due to nitric acid. On the basis of the result of the experiments, the temperature control range of ozone gas which contains nitrogen gas and passes through the ozone flow rate control device was determined as from 47° C. of the boiling point of nitrogen pentoxide to 60° C.

Figure 5:
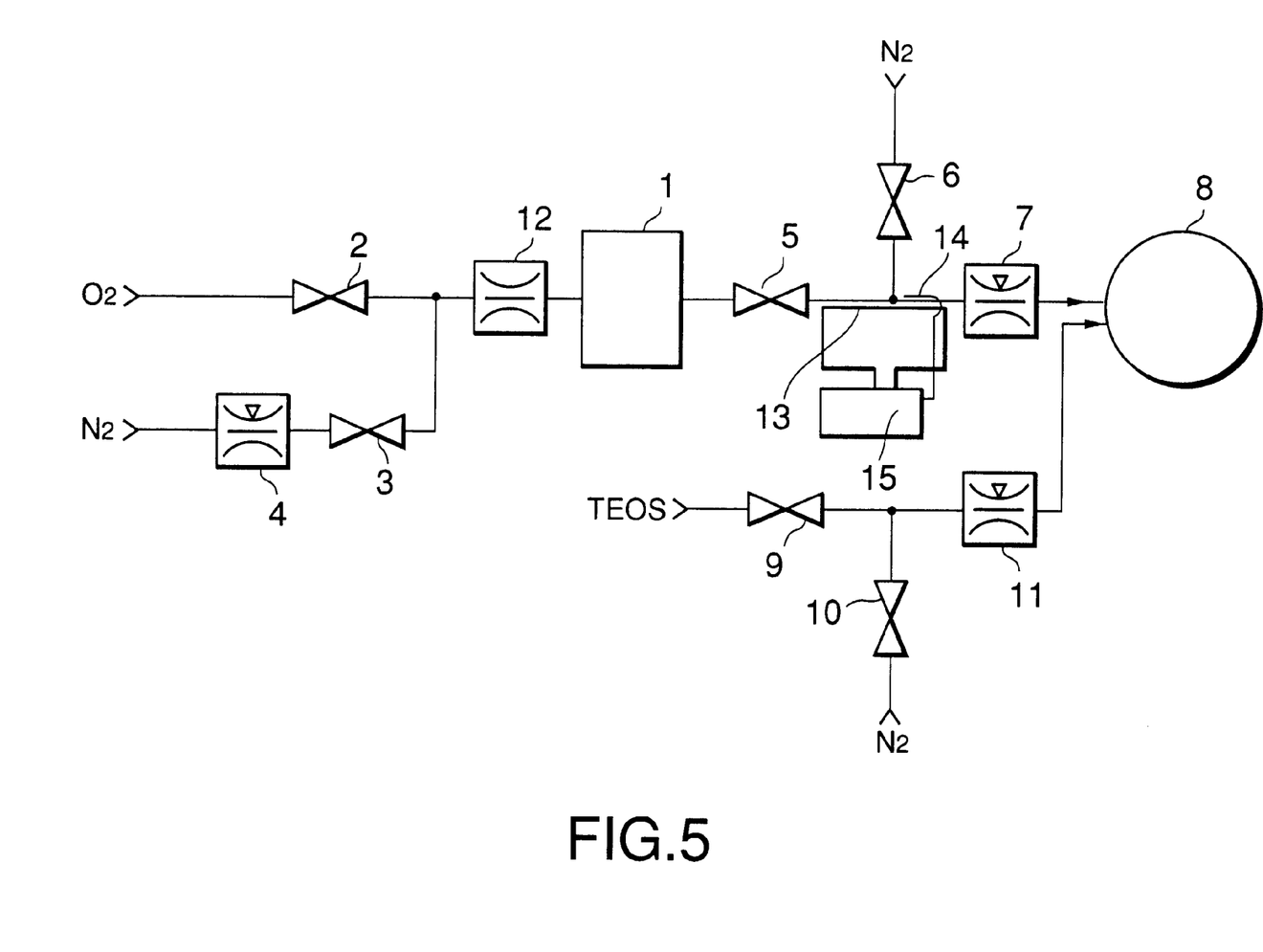
FIG. 5 is a block diagram of a CVD device using an ozone flow rate control device according to a second embodiment of the present invention.

A second embodiment of the present invention will be described with reference to FIG. 5. In the second embodiment, a heater 13 and a temperature sensor 14 which are used in the first embodiment is mounted on not the mass flow controller 7 but a gas piping from an air valve 5 succeeding to an ozone generator 1 to the mass flow controller 7 and the temperature of the piping is controlled in the range from 47° C. to 60° C. by a temperature control portion 15. In the second embodiment, the temperature control timing is similar to that in the first embodiment. An effect obtained in the second embodiment is the same as that of the first embodiment.

Figure 6:
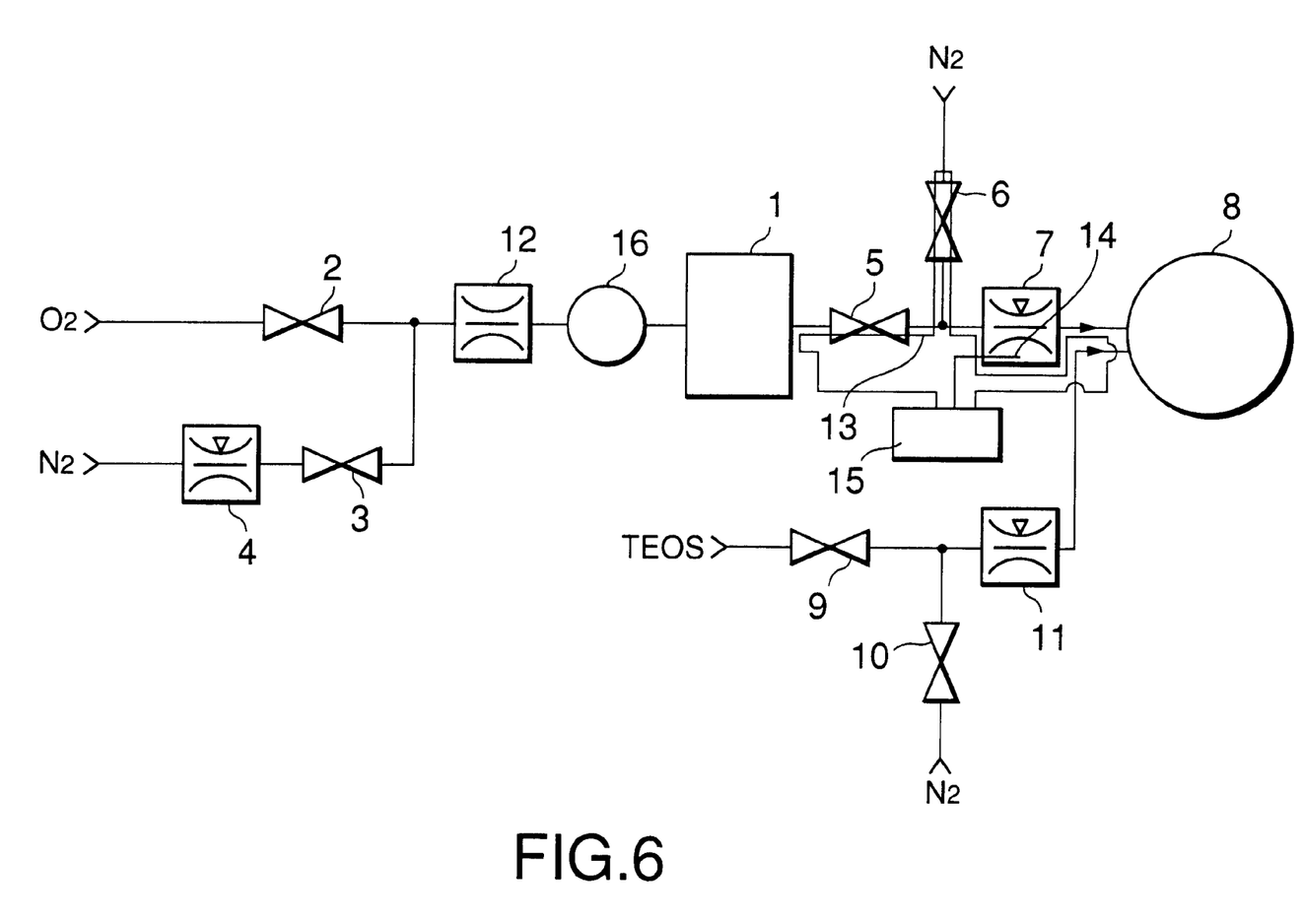
FIG. 6 is a block diagram of a CVD device using an ozone flow rate control device according to a third embodiment of the present invention.

A third embodiment will be described with reference to FIG. 6. In the third embodiment, a heater 13 is mounted such that all gas piping parts arranged between an ozone generator 1 to an atmospheric pressure CVD chamber 8, which are in contact with ozone gas, can bake substance deposited thereon and temperature of the heater 13 is controlled by a temperature control portion 15 on the basis of temperature detected by a temperature sensor 14 embedded in a body portion 62 of a mass flow controller 7. The provision of the heater 13 covering the portion of the gas piping from the mass flow controller 7 to the atmospheric pressure CVD chamber 8 is to prevent the piping portion from being corroded and has no direct relation to the measures against abnormality of flow rate of the mass flow controller 7. Further, in order to remove water content of ozone gas, means 16 for removing water from the gas is provided in the gas piping portion upstream of the ozone generator 1. The water removing means 16 may be a water remover or a gas purifier containing gas desiccant such as silica gel or molecular sieve.

An operation of the third embodiment will be described. Prior to flow of ozone gas, air valves 2 and 5 are opened to make the ozone generator 1 inoperable. Then, ozone gas whose water content is removed is supplied to the atmospheric pressure CVD chamber 8 under the flow rate control of the mass flow controller 7 and, simultaneously therewith, temperature of the ozone line piping portion is set to 60° C. by the heater 13, the temperature sensor 14 and the temperature control portion 15 to remove water content adsorbed on inner surfaces of the ozone piping, air valves 5 and 6 and the mass flow controller 7. Thereafter, the temperature of the ozone line piping portion is controlled in the range from 47° C. to 60° C. by the temperature control portion 15 with the same temperature control timing as that in the first and second embodiments. In the case of the third embodiment, the effect of preventing clogging of the inlet portion of the sensor pipe of the mass flow controller 7 in the ozone line with deposition of nitrogen pentoxide is obtained similarly to the first and second embodiments. Further, in the third embodiment, since the water content removing means 16 is provided and the heater 13 is arranged such that the gas piping portion of the ozone line can bake substance deposited on the inner surface thereof to dry the inside of the piping by flowing ozone gas whose water content is removed therethrough, an abnormal flow rate due to corrosion of the piping in the mass flow controller 7 as described in the first embodiment with reference to FIG. 7 can be prevented. As a result the life of the mass flow controller 7 is further elongated compared with the cases of the first and second embodiments.

Although the present invention has been described with reference to specific embodiments, this description is not meant to be construed in a limiting sense. Various modifications of the disclosed embodiments will become apparent to persons skilled in the art upon reference to the description of the invention. It is, therefore, contemplated that the appended claims will cover any modifications or embodiments as fall within the true scope of the invention.

What is claimed is:

1. An ozone flow rate control device for controlling a flow rate of ozone gas supply, comprising:

an inlet pipe to which ozone gas containing nitrogen pentoxide is supplied;

a bypass pipe and a sensor pipe branched from said inlet pipe;

a control signal generator circuit for measuring a variation of temperature of said sensor pipe and generating a control signal corresponding to a flow rate of the ozone gas;

an outlet pipe connected to said bypass pipe and said sensor pipe;

a valve provided in said outlet pipe and having an opening controlled correspondingly to the control signal; and heating means for heating the ozone gas containing nitrogen pentoxide supplied to said sensor pipe to a predetermined temperature.

2. An ozone flow rate control device as claimed in claim 1, wherein the predetermined temperature is in a range from 47° C. to 60° C.

3. An ozone flow rate control device as claimed in claim 1, wherein said heating means comprises a heater for heating at least said inlet pipe, a temperature sensor for measuring temperature of said inlet pipe and a temperature control circuit for controlling said heater correspondingly to a temperature information from said temperature sensor.

4. An ozone gas supply device for supplying ozone gas containing nitrogen gas to a chamber, comprising:

an ozone gas generator for generating ozone gas from oxygen gas and nitrogen gas;

an ozone flow rate control device supplied with the ozone gas generated by said ozone generator through a gas pipe, for supplying the ozone gas to said chamber at a predetermined flow rate; and heating means for heating said gas pipe to a predetermined temperature and supplying the heated ozone gas to said ozone flow rate control device.

5. An ozone gas supply device as claimed in claim 4, wherein the predetermined temperature is in a range from 47° C. to 60° C.

6. An ozone gas supply device as claimed in claim 4, wherein said heating means comprises a heater for heating at least said inlet pipe, a temperature sensor for measuring temperature of said inlet pipe and a temperature control circuit for controlling said heater correspondingly to a temperature information from said temperature sensor.

7. An ozone gas supply device for supplying ozone gas containing nitrogen gas to a chamber, comprising:

an ozone gas generator for generating ozone gas from oxygen gas and nitrogen gas;

an ozone flow rate control device supplied with the ozone gas generated by said ozone generator through a gas pipe, for supplying the ozone gas to said chamber at a predetermined flow rate; and heating means for heating a piping from said gas pipe to said chamber to a predetermined temperature.

8. An ozone gas supply device as claimed in claim 7, wherein the predetermined temperature is in a range from 47° C. to 60° C.

9. An ozone gas supply device as claimed in claim 8, wherein said heating means comprises a heater for heating said piping from said gas pipe to said chamber, a temperature sensor for measuring temperature of said piping and a temperature control circuit for controlling said heater correspondingly to a temperature information from said temperature sensor.

10. An ozone gas supply device as claimed in claim 7, further comprising water removing means provided in said gas pipe, for removing water content of the gas.

11. An ozone gas supply device for supplying ozone gas containing nitrogen gas to a chamber, comprising:

an ozone gas generator generating ozone gas containing nitrogen pentoxide from oxygen gas and nitrogen gas;

an ozone flow rate control device supplied with said ozone gas generated by said ozone gas generator through a gas pipe, for supplying the ozone gas to said chamber at a predetermined flow rate; and heating means for heating said gas pipe to a predetermined temperature and supplying the heated ozone gas to said ozone flow rate control device.

12. The ozone gas supply device as claimed in claim 11, wherein the predetermined temperature is in a range from 47° C. to 60° C.

13. The ozone gas supply device as claimed in claim 11, wherein said heating means comprises a heater for heating at least said inlet pipe, a temperature sensor for measuring temperature of said inlet pipe and a temperature control circuit for controlling said heater correspondingly to a temperature information from said temperature sensor.

14. The ozone gas supply device as claimed in claim 11, further comprising heating means for heating said ozone flow rate control device and said piping between said ozone flow rate control device and said chamber to a predetermined temperature.

15. The ozone gas supply device as claimed in claim 14, wherein the predetermined temperature is in a range from 47° C. to 60° C.

16. The ozone gas supply device as claimed in claim 14, wherein said heating means comprises a heater for heating at least said inlet pipe, a temperature sensor for measuring temperature of said inlet pipe and a temperature control circuit for controlling said heater correspondingly to a temperature information from said temperature sensor.

17. The ozone gas supply device as claimed in claim 14, further comprising water removing means provided in said gas pipe, for removing water content of the gas.

* * * * *